United States Patent
Biber et al.

(10) Patent No.: US 10,338,182 B2
(45) Date of Patent: Jul. 2, 2019

(54) RECEIVER ASSEMBLY OF A MAGNETIC RESONANCE IMAGING SYSTEM

(71) Applicants: Stephan Biber, Erlangen (DE); Jan Bollenbeck, Bubenreuth (DE)

(72) Inventors: Stephan Biber, Erlangen (DE); Jan Bollenbeck, Bubenreuth (DE)

(73) Assignee: Siemens Aktiengesellschaft, München (DE)

(*) Notice: Subject to any disclaimer, the term of this patent is extended or adjusted under 35 U.S.C. 154(b) by 1021 days.

(21) Appl. No.: 14/657,852

(22) Filed: Mar. 13, 2015

(65) Prior Publication Data
US 2015/0260821 A1   Sep. 17, 2015

(30) Foreign Application Priority Data
Mar. 13, 2014   (DE) .................. 10 2014 204 706

(51) Int. Cl.
*G01R 33/36*     (2006.01)
*G01R 33/54*     (2006.01)
*G01R 33/58*     (2006.01)

(52) U.S. Cl.
CPC ....... *G01R 33/583* (2013.01); *G01R 33/3621* (2013.01); *G01R 33/543* (2013.01)

(58) Field of Classification Search
CPC . G01R 33/583; G01R 33/3621; G01R 33/543
USPC ................................................ 324/300–322
See application file for complete search history.

(56) References Cited

U.S. PATENT DOCUMENTS

| | | | | |
|---|---|---|---|---|
| 8,106,658 | B2* | 1/2012 | Wang | ............. G01R 33/36 324/300 |
| 8,587,311 | B2* | 11/2013 | Nnewihe | ............. G01R 33/3415 324/318 |
| 2003/0076187 | A1 | 4/2003 | Oppelt et al. | |
| 2003/0132750 | A1 | 7/2003 | Machida | |
| 2008/0013811 | A1 | 1/2008 | Ikezaki | |
| 2010/0033180 | A1 | 2/2010 | Biber et al. | |

(Continued)

FOREIGN PATENT DOCUMENTS

| | | |
|---|---|---|
| CN | 1450358 A | 10/2003 |
| CN | 101105522 A | 1/2008 |

(Continued)

OTHER PUBLICATIONS

Siemens AG, Bollenbeck, J. et al., ISMRM 2005 Poster "A high performance multi-channel RF Receiver for Magnet Resonance Imaging Systems," 2005.

(Continued)

*Primary Examiner* — Melissa J Koval
*Assistant Examiner* — Rahul Maini
(74) *Attorney, Agent, or Firm* — Lempia Summerfield Katz LLC

(57) ABSTRACT

A receiver assembly of a magnetic resonance (MR) system for generating MR recordings of an examination object includes a plurality of reception channels for receiving and amplifying MR signals from reception coils of the MR system connected therewith. A calibration data memory for storing calibration data for the plurality of reception channels is arranged on the receiver assembly. The receiver assembly includes a data link for transmitting the calibration data to the MR system.

18 Claims, 2 Drawing Sheets

(56) References Cited

U.S. PATENT DOCUMENTS

| | | | |
|---|---|---|---|
| 2011/0254551 A1* | 10/2011 | Leussler | G01R 33/3614 |
| | | | 324/318 |
| 2012/0086449 A1* | 4/2012 | Graesslin | G01R 33/285 |
| | | | 324/318 |
| 2013/0307538 A1 | 11/2013 | Pfeuffer | |
| 2015/0039206 A1* | 2/2015 | Storch | F02D 28/00 |
| | | | 701/103 |

FOREIGN PATENT DOCUMENTS

| | | |
|---|---|---|
| CN | 101644750 A | 2/2010 |
| DE | 10148441 C1 | 3/2003 |
| DE | 102008036496 A1 | 2/2010 |

OTHER PUBLICATIONS

German Office Action for related German Application No. 10 2014 204 706.4, dated Dec. 18, 2014, with English Translation.
Chinese Office Action for Chinese Application No. 201510090601.0 dated Sep. 3, 2018, with English Translation.

* cited by examiner

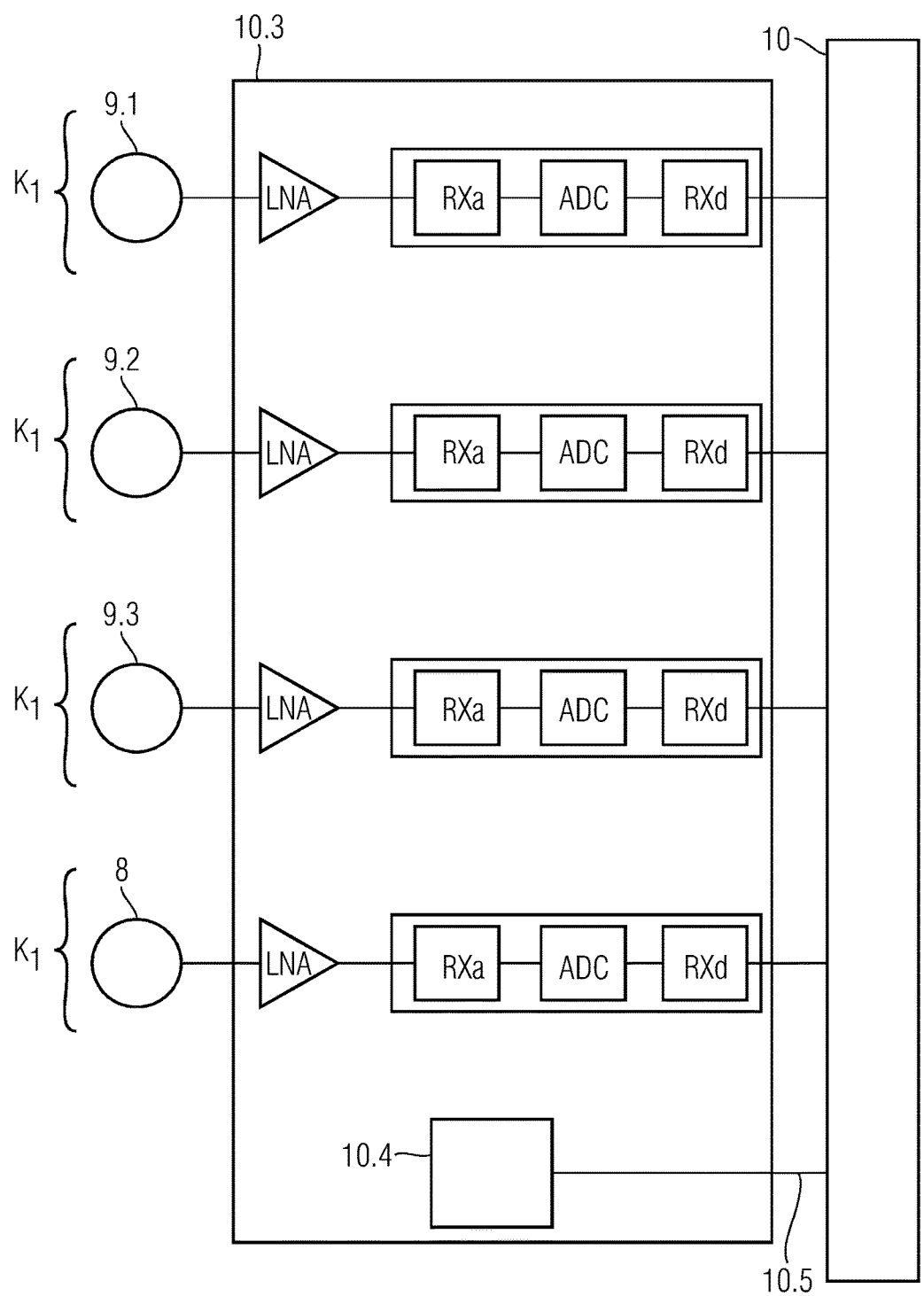

RECEIVER ASSEMBLY OF A MAGNETIC RESONANCE IMAGING SYSTEM

This application claims the benefit of DE 10 2014 204 706.4, filed on Mar. 13, 2014, which is hereby incorporated by reference in its entirety.

BACKGROUND

The present embodiments relate to a receiver assembly of a magnetic resonance (MR) system for generating MR recordings of an examination object.

MR systems include a plurality of reception channels, each including a plurality of components connected in series and through which received MR signals (e.g., reception signal, RX signal) pass. For each channel, these components include a coil acting as antenna, a preamplifier, possibly with frequency conversion, a receiver including a first analog portion (e.g., analog RX) for preparing and digitizing the signal, and a second digital portion (e.g., digital RX) for decimation filtering.

As a result of the high signal dynamic response of the received magnetic resonance signals, particularly in the case of magnetic field strengths above 1.5 Tesla, switching of the reception path distributed gain (e.g., RX gain) is provided in one or more steps (e.g., gain step, 6 dB) in order to be able to process the high dynamic response of the MR signals. In the case of two gain stages (e.g., low gain, high gain), the reception path is operated in the high gain operating state with more gain and a lower noise figure (NF) of the RX system for a certain portion of the k-space of the Fourier-transformed MR signals to be sampled and operated in the low gain operating state with less gain and slightly higher noise figure for the central region of the k-space. This switching of the reception path distributed gain is brought about by switchable damping members or switchable amplifiers (e.g., switchable gain amplifiers, SGAs) within the analog RX system prior to sampling by an analog/digital converter (ADC). Since the switching takes place within a k-space, the transmission magnitudes and phases of the respective reception paths, which are dependent on the gain settings, are to be tuned precisely to one another (e.g., calibrated), because otherwise a gain and/or phase jump is produced in the k-space. This leads to image artifacts after the Fourier transform into the image space.

Calibrating the RX system is complicated and often brought about by a function incorporated in the system. A common test transmission signal (TTX) is distributed over all components to be calibrated. After the distribution thereof over the various reception paths to be calibrated in relation to one another, these TTXs are to have the same or at least known amplitudes and phase relationships. After distributing and recording the TTX signal, the amplitudes and phases of the MR signals may be recorded relative to one another and/or relative to the set high-gain level or low-gain level, and calibration factors may be derived relative to an arbitrarily selected channel. The calibration factors eliminate the phase and amplitude effect of the gain switching on the RX signal.

Such a calibration may take place in reception channels installed in the MR system and use a relatively high time outlay. The calibration procedure is to be carried out on the MR system after each replacement of a component of the reception chain or of an entire reception chain of one or more channels.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a receiver assembly of a magnetic resonance imaging (MRI) system and a magnetic resonance imaging system that make it possible to carry out a calibration process in a manner that is simpler and less disruptive to a running operation of a magnetic resonance (MR) system are provided.

A receiver assembly and a magnetic resonance system are embodied such that an actual calibration process occurs outside of a magnetic resonance system, but previously established calibration factors may be made available to the magnetic resonance system for artifact-free image reconstruction. According to one or more of the present embodiments, the receiver assemblies situated in the magnetic resonance system may be embodied such that a memory module is available therein. The memory module makes previously established calibration factors available. The calibration factors were established in a separate calibration process occurring outside of the magnetic resonance system and stored in the memory module. Consequently, if a receiver assembly is installed or replaced, the magnetic resonance system may obtain all necessary information for carrying out an artifact-free image reconstruction by a simple access to the calibration factors stored in the receiver assembly.

The reception paths for MR signals, which may carry a plurality of reception channels, are embodied in a replaceable manner in the form of receiver assemblies. The calibration data for the reception channels situated on a receiver assembly are stored on each receiver assembly in a manner recallable by the MR system. Here, the calibration data are also stored as a function of the respectively available gain stage if the receiver assembly contains gain switching.

Although in most cases the entire calibration will be digital in terms of amplitude and phase, there may, however, also be a combination of analog calibration for the amplitude or phase and digital calibration for the phase or amplitude. Accordingly, a corresponding actuator (e.g., a potentiometer or phase shifter) is set during the calibration in the analog/digital case, and the phase or amplitude is corrected via digitally stored calibration factors. In the case of complete digital calibration, the calibration factors, both in terms of phase and in terms of amplitude, are stored digitally on the receiver assembly in a recallable manner, optionally for each adjustable gain stage.

With respect to recallable storage of the calibration data, reference is made to the fact that the case where the calibration data is not recalled directly from the receiver assembly but where the receiver assembly only stores a unique identifier that may be used to recall the calibration data based on this identifier from a different data storage medium, such as, for example, a CD, or via any other data link from an external source (e.g., directly from the producer via the Internet) also falls within the scope of the invention.

The present embodiments enable a calibration of the gain components outside of the actual MR system, generally already during the production of the reception assemblies. If such an assembly is installed into the MR system, the system may resort to the already stored calibration data, without separate calibration procedures having to be carried out.

A receiver assembly of an MR system for generating MR recordings of an examination object is provided. The receiver assembly includes a plurality of reception channels, respectively for receiving and amplifying MR signals from reception coils of the MR system connected therewith. According to one or more of the present embodiments, there is a calibration data memory for storing calibration data for the reception channels situated on the receiver assembly, and a data link for transmitting the calibration data to the MR system.

In a first analog/digital embodiment, the receiver assembly may be configured such that an analog calibrating device for channel-by-channel calibration of at least one amplitude gain of the incoming MR signals is arranged on at least one reception channel, and calibration data for calibrating the phase of the incoming MR signals are in the calibration data memory.

In another analog/digital embodiment, the receiver assembly may be configured such that an analog calibrating device for channel-by-channel calibration of at least one phase of the incoming MR signals is arranged on at least one reception channel, and calibration data for calibrating the amplitude of the incoming MR signals are in the calibration data memory.

However, in one embodiment, the receiver assembly may be configured to be calibrated completely digitally such that calibration data for calibrating the phase and the amplitude of the incoming MR signals are in the calibration data memory.

If a plurality of gain switching steps (e.g., gain steps) are realized (e.g., switching of the gain in a plurality of switching steps of in each case 6 dB), the calibration for each gain switching step is brought about such that a plurality of calibration data records are also generated in accordance with the number of gain switching steps that may be set. Accordingly, at least one reception channel may enable at least one gain switching step, and the calibration data memory may include individual calibration data for each gain switching step.

In addition to the receiver assembly, an MR system including at least one of the aforementioned receiver assemblies is provided. For example, the MR system, which serves to generate MR recordings of an examination object, includes an arrangement of magnet systems for producing a homogeneous main magnetic field and additional gradient fields for spatial encoding. The MR system also includes at least one transmission coil system for producing alternating electromagnetic fields so as to induce an MR signal, a plurality of reception coils for receiving the MR signals emitted by the examination object and forwarding these to a plurality of reception channels, and a computer system including control electronics. The control electronics include a memory for storing computer programs that, during operation, control the magnetic resonance system and evaluate the measured MR signals. The control electronics include at least one interchangeable receiver assembly with in each case a plurality of reception channels for channel-by-channel gain of the received MR signals.

The MR system may include at least one data link for transmitting calibration data from the at least one receiver assembly to the MR system. By way of example, this may be a direct data link between the calibration data memory and the computer system of the MR system or the control electronics. However, the calibration data may also be transmitted via a bus system used for further data transmissions.

The memory of the computer system may have at least one computer program configured such that, during operation, at least after installation or change of a receiver assembly, the at least one computer program (e.g., executed with a processor) reads out the calibration data memory with respect to the calibration data present there and uses and/or stores the calibration data for channel-by-channel calibration of the gain switching steps.

The receiver assembly may include an electronically readable bijective identifier, and at least one computer program (e.g., executed with the processor) that, based on the identifier, determines the currentness of the calibration data may be present in the memory.

In the MR system according to one or more of the present embodiments, there may also be a version identifier of the calibration data in the calibration data memory, and at least one computer program may be present in the memory. The at least one computer program (e.g., executed with the processor) determines the currentness of the calibration data based on the version identifier.

The MR system according to one or more of the present embodiments may contain at least one computer program in the memory. The computer program is configured such that, during operation, the computer program (e.g., executed with the processor) reads out current calibration data from the calibration memory if the calibration data is not current and stores the current calibration data in the memory of the computer and/or uses the current calibration data for calibration.

The following reference signs are used: 1: MR system; 2: housing; 3: patient couch; 4: patient; 5: main magnet; 6: gradient magnet system; 7: whole body coil system; 7.1-7.2: individual transmission coils of the whole body coil system; 8: reception coil system; 9: local reception coil system; 9.1-9.3: individual coils of the reception coil system; 10: computer system; 10.1: memory; 10.2: control electronics; 10.3: reception channel assembly; 10.4: calibration data memory; 10.5: data link; 11: control and data lines; ADC: analog/digital converter; $B_0$: homogeneous magnetic field; $B_1$: alternating electromagnetic field; $BG_x$, $BG_y$, $BG_z$: main directions of the gradient fields; $K_1$-$K_4$: reception channels; LNA: preamplifier; $Prg_1$-$Prg_n$: computer program; RXa: analog reception portion; RXd: digital reception portion.

BRIEF DESCRIPTION OF THE DRAWINGS

FIG. 2 shows one embodiment of a receiver assembly with four channels and calibration data memory.

DETAILED DESCRIPTION

Figure 1:
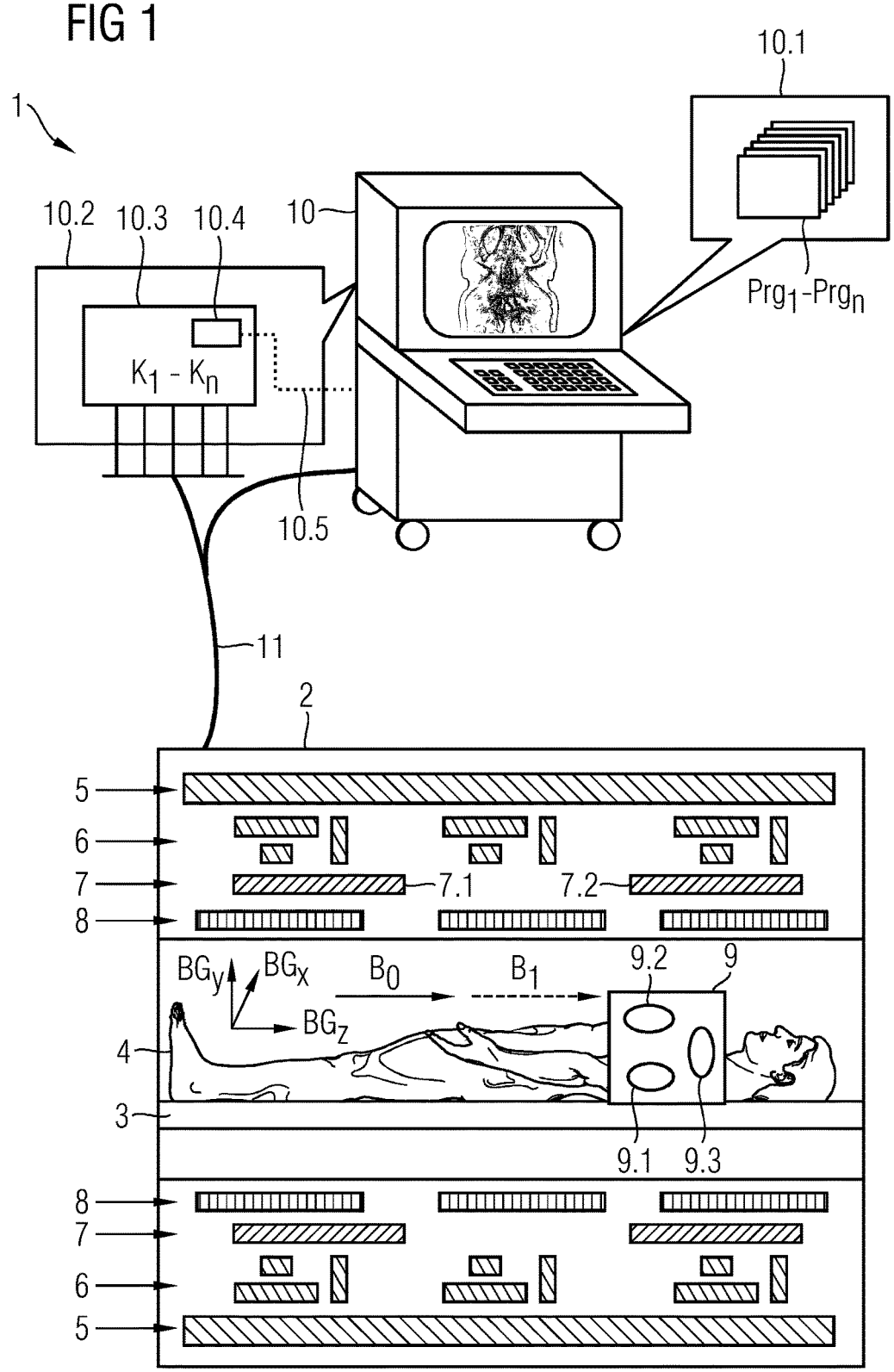
FIG. 1 shows one embodiment of a magnetic resonance imaging (MRI) system with individually actuated individual coils of a whole body coil system and of a local coils system.

FIG. 1 shows a schematic illustration of one embodiment of a magnetic resonance (MR) system 1 including a housing 2, in which a patient couch 3 with a patient 4 is situated for the purposes of an MR examination. The typical magnet systems of an MR system are depicted schematically within the housing 2. These include a main magnet 5 that generates a largely homogeneous magnetic field $B_0$ in a measurement region of the MR system. For the purposes of providing spatial encoding to the induced MR signals, gradient fields are generated in three main directions $BG_x$, $BG_y$, $BG_z$ using additional gradient magnet systems 6. A whole body coil system 7 with two individual transmission coils 7.1 and 7.2, which is securely installed in the housing, serves to generate an alternating electromagnetic field $B_1$ that induces the MR signals in the patient.

A securely installed reception coil system 8 and a further local reception coil system 9 including the schematically depicted individual coils 9.1, 9.2 and 9.3 are shown for the purposes of receiving the MR signals generated by the alternating electromagnetic field $B_1$. In the present example, the local reception coil system 9 is situated in the region of the chest in order, for example, to be able to receive the MR signals induced there. Other or a plurality of regions may also be equipped with appropriately configured local reception coil systems within the scope of one or more of the present embodiments.

For the purposes of controlling the MR system 1, including the evaluation of the received MR signals, the reconstruction of tomographic MR recordings and the display of MR recordings, use is made of a computer system 10 that is connected to the magnet systems 5 and 6, the transmission coils 7 and the reception coils 8 and 9 via a plurality of control and data lines 11. The control electronics 10.2, in which a receiver assembly 10.3 is shown, have been schematically emphasized next to the computer system 10. This receiver assembly 10.2 includes a plurality of reception channels $K_1$ to $K_n$ that have contact with the reception coils. Additionally, a data link 10.5 is also illustrated between the calibration data memory 10.4 and the computer system 10 in order to show that the computer system 10 has direct access to the calibration data memory 10.4 in order there to read out and use the calibration factors previously stored in the receiver assembly 10.3.

Accordingly, it is no longer necessary to undertake the calibration of the reception channels in the MR system 1, but this calibration may rather already take place prior to the installation of the receiver assembly 10.3 (e.g., may already take place during the production process thereof). The calibration factors obtained in the process, which are also obtained at different gain factors, are then stored in the calibration data memory 10.4 such that the calibration factors are available after the installation into the MR system 1.

For the purposes of operating the MR system 1, including the actuation of the magnet coil systems, the transmission coil systems, and the reception coil systems, and also for the purpose of analyzing the MR signals with the reconstruction of tomographic MR recordings, the computer system 10 includes a memory 10.1 (e.g., a non-transitory computer-readable storage medium). Computer program code in the form of a plurality of computer programs $Prg_1$-$Prg_n$ that are executed during operation are stored in the memory 10.1. For example, the MR system 1, according to one or more of the present embodiments, also includes a computer program that, during operation, reads out the calibration data stored in the calibration data memory 10.4 and, while using these calibration data, corrects the measurement data from the received MR signals and therefore carries out the reconstruction of the MR image data.

A more detailed illustration of an exemplary receiver assembly 10.3 with the channel-by-channel connections to the reception coils 9.1, 9.2, 9.3 and 8 and to the computer system 10 is shown in FIG. 2. A total of four reception channels $K_1$ to $K_4$ that substantially have the same configuration and, from the left, start with the reception coils 9.1, 9.2, 9.3 and 8 are depicted. This is followed by an analog pre-amplification with, in each case, a preamplifier low noise amplifier (LNA). The pre-amplified MR signal is then guided to the reception stage, in which the pre-amplified MR signal is initially prepared in an analog manner in the analog reception portion RXa. This is followed by an analog/digital conversion in the ADC and, thereupon, further digital processing in the digital reception portion RXd. The prepared digital MR signal is then forwarded to the computer system 10. As a result of the calibration data from the calibration data memory 10.4 on the receiver assembly 10.3 (e.g., data was previously read out by the computer system 10), the computer system 10 is then able to calibrate the gain switching prior to the reconstruction such that inaccuracies in the gain switching do not lead to artifacts in MR imaging, without this necessitating a calibration process with an installed receiver assembly 10.3.

Thus, a receiver assembly of an MR system including a plurality of reception channels for receiving and for amplifying MR signals is provided. A calibration data memory for storing calibration data for the reception channels is situated on the receiver assembly, and there is a data link for transmitting the calibration data to the MR system. An MR system that is equipped with at least one such receiver assembly is also provided.

Although the invention is described and illustrated more closely in detail by the exemplary embodiments, the invention is not restricted by the disclosed examples. Other variations may be derived herefrom by a person skilled in the art, without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A receiver assembly of a magnetic resonance (MR) system for generating MR recordings of an examination object, the receiver assembly comprising:
   a plurality of reception channels for receiving and amplifying MR signals from reception coils of the MR system connected therewith, the reception coils of the MR system being positioned remotely from the receiver assembly;
   a calibration data memory configured to store calibration data for the plurality of reception channels situated on the receiver assembly; and
   a data link operable to transmit the calibration data to the MR system,
   wherein the receiver assembly is a replaceable part, such that the plurality of reception channels are configured to be calibrated outside, or inside and outside of the MR system.

2. The receiver assembly of claim 1, wherein an analog calibrating device for channel-by-channel calibration of at least one amplitude gain of the incoming MR signals is arranged on at least one reception channel of the plurality of reception channels, and calibration data for calibrating a phase of the incoming MR signals is in the calibration data memory.

3. The receiver assembly of claim 1, wherein an analog calibrating device for channel-by-channel calibration of at least one phase of the incoming MR signals is arranged on at least one reception channel of the plurality of reception channels, and calibration data for calibrating an amplitude of the incoming MR signals is in the calibration data memory.

4. The receiver assembly of claim 1, wherein calibration data for calibrating a reception path transmission phase and a reception path transmission magnitude are present in each case in the calibration data memory for each gain switching step.

5. The receiver assembly of claim 1, wherein at least one reception channel of the plurality of reception channels includes at least one gain stage switchable with respect to a gain power, and the calibration data memory has individual calibration data for each switched gain stage.

6. The receiver assembly of claim 2, wherein at least one reception channel of the plurality of reception channels includes at least one gain stage switchable with respect to a gain power, and the calibration data memory has individual calibration data for each switched gain stage.

7. The receiver assembly of claim 3, wherein at least one reception channel of the plurality of reception channels includes at least one gain stage switchable with respect to a gain power, and the calibration data memory has individual calibration data for each switched gain stage.

8. The receiver assembly of claim 4, wherein at least one reception channel of the plurality of reception channels includes at least one gain stage switchable with respect to a gain power, and the calibration data memory has individual calibration data for each switched gain stage.

9. An MR system for generating magnetic resonance (MR) recordings of an examination object, the MR system including:
   an arrangement of magnet systems operable to produce a homogeneous main magnetic field and additional gradient fields for spatial encoding;
   at least one transmission coil system operable to produce alternating electromagnetic fields so as to induce an MR signal;
   a plurality of reception coils operable to receive MR signals emitted by the examination object and forward the received MR signals to a plurality of reception channels; and
   a computer system comprising control electronics, the control electronics including a memory configured to store computer programs that, during operation, control the MR system and evaluate measured MR signals,
   wherein the control electronics include at least one interchangeable receiver assembly, the at least one interchangeable receiver assembly having a plurality of reception channels for channel-by-channel gain of the received MR signals, and
   wherein the at least one interchangeable receiver assembly comprises:
      the plurality of reception channels for receiving and amplifying the MR signals from the plurality of reception coils, the plurality of reception coils being positioned remotely from the receiver assembly;
      a calibration data memory configured to store calibration data for the plurality of reception channels situated on the at least one receiver assembly such that the plurality of reception channels are configured to be calibrated outside, or inside and outside of the MR system; and
      a data link operable to transmit the calibration data to the MR system.

10. The MR system of claim 9, wherein the memory includes at least one computer program configured to, at least after installation or change of a receiver assembly of the at least one receiver assembly, read out the calibration data memory with respect to the calibration data present at the calibration data memory and use or store the calibration data for channel-by-channel calibration of gain switching steps.

11. The MR system of claim 9, wherein the at least one receiver assembly comprises an electronically readable bijective identifier, and at least one computer program configured to determine a currentness of the calibration data based on whether the identifier is present in the memory.

12. The MR system of claim 9, wherein a version identifier of the calibration data is present in the calibration data memory, and at least one computer program configured to determine a currentness of the calibration data based on whether the version identifier is present in the memory.

13. The MR system of claim 9, wherein the memory of the computer system stores at least one computer program configured to read out current calibration data from the calibration memory when the calibration data is not current, and
   wherein the at least one computer program is also configured to store the current calibration data in the memory of the computer, use the current calibration data for calibration, or a combination thereof.

14. The MR system of claim 10, wherein the at least one receiver assembly comprises an electronically readable bijective identifier, and at least one computer program configured to determine a currentness of the calibration data based on whether the identifier is present in the memory.

15. The MR system of claim 10, wherein a version identifier of the calibration data is present in the calibration data memory, and at least one computer program configured to determine a currentness of the calibration data based on whether the version identifier is present in the memory.

16. The MR system of claim 11, wherein a version identifier of the calibration data is present in the calibration data memory, and at least one computer program configured to determine a currentness of the calibration data based on whether the version identifier is present in the memory.

17. The MR system of claim 11, wherein the memory of the computer system stores at least one computer program configured to read out current calibration data from the calibration memory when the calibration data is not current, and
   wherein the at least one computer program is also configured to store the current calibration data in the memory of the computer, use the current calibration data for calibration, or a combination thereof.

18. The MR system of claim 12, wherein the memory of the computer system stores at least one computer program configured to read out current calibration data from the calibration memory when the calibration data is not current, and
   wherein the at least one computer program is also configured to store the current calibration data in the memory of the computer, use the current calibration data for calibration, or a combination thereof.

* * * * *